(12) United States Patent
Yoshikawa et al.

(10) Patent No.: US 7,618,753 B2
(45) Date of Patent: Nov. 17, 2009

(54) PHOTOMASK BLANK, PHOTOMASK AND METHOD FOR PRODUCING THOSE

(75) Inventors: Hiroki Yoshikawa, Niigata (JP); Yukio Inazuki, Niigata (JP); Yoshinori Kinase, Niigata (JP); Satoshi Okazaki, Niigata (JP); Takashi Haraguchi, Tokyo (JP); Masahide Iwakata, Tokyo (JP); Mikio Takagi, Tokyo (JP); Yuichi Fukushima, Tokyo (JP); Tadashi Saga, Tokyo (JP)

(73) Assignees: Shin-Etsu Chemical Co., Ltd., Tokyo (JP); Toppan Printing Co., Ltd., Tokyo (JP)

( * ) Notice: Subject to any disclaimer, the term of this patent is extended or adjusted under 35 U.S.C. 154(b) by 460 days.

(21) Appl. No.: 11/662,479

(22) PCT Filed: Aug. 10, 2005

(86) PCT No.: PCT/JP2005/014643

§ 371 (c)(1),
(2), (4) Date: Mar. 12, 2007

(87) PCT Pub. No.: WO2006/027928

PCT Pub. Date: Mar. 16, 2006

(65) Prior Publication Data

US 2007/0259276 A1    Nov. 8, 2007

(30) Foreign Application Priority Data

Sep. 10, 2004  (JP)  .................. 2004-263482

(51) Int. Cl.
*G03F 1/00*  (2006.01)

(52) U.S. Cl. ......................................................... 430/5
(58) Field of Classification Search .................. 430/5, 430/322, 323, 324, 394
See application file for complete search history.

(56) References Cited

U.S. PATENT DOCUMENTS 4,717,625 A    1/1988  Watakabe et al.

(Continued)

FOREIGN PATENT DOCUMENTS

EP            213693 B1    8/1991

(Continued)

OTHER PUBLICATIONS

Communication from European Patent Office regarding Application No. 5 770 691.3 dated Aug. 19, 2009 citing US 6,008,135, 4 pages.

*Primary Examiner*—Stephen Rosasco
(74) *Attorney, Agent, or Firm*—Finnegan, Henderson, Farabow, Garrett & Dunner LLP (57) ABSTRACT

A metal film is provided as a light shielding layer on one principle surface of a photomask substrate. The metal film cannot be substantially etched by chlorine-based dry etching containing oxygen ((Cl+O)-based dry etching) and can be etched by chlorine-based dry etching not containing oxygen (Cl-based dry etching) and fluorine-based dry etching (F-based dry etching). On the light shielding layer, a metal compound film as an antireflective layer. The metal compound film cannot be substantially etched by chlorine-based dry etching not containing oxygen (Cl based) and can be etched by at least one of chlorine-based dry etching containing oxygen ((Cl+O) based) and fluorine-based dry etching (F based).

20 Claims, 6 Drawing Sheets

U.S. PATENT DOCUMENTS

| | | | |
|---|---|---|---|
| 4,783,371 A | 11/1988 | Watakabe et al. | |
| 4,792,461 A | 12/1988 | Watakabe et al. | |
| 5,750,290 A * | 5/1998 | Yasuzato et al. | 430/5 |
| 6,008,135 A | 12/1999 | Oh et al. | |
| 6,514,642 B2 | 2/2003 | Okazaki et al. | |
| 6,599,667 B2 | 7/2003 | Yusa et al. | |
| 7,115,341 B2 * | 10/2006 | Shiota et al. | 430/5 |
| 2002/0039689 A1 | 4/2002 | Yusa et al. | |
| 2003/0003756 A1 | 1/2003 | Yu | |
| 2005/0238963 A1 | 10/2005 | Ishibashi et al. | |
| 2006/0057469 A1 | 3/2006 | Kureishi et al. | |

FOREIGN PATENT DOCUMENTS

| | | |
|---|---|---|
| EP | 1152292 A2 | 8/2004 |
| JP | 59-139033 | 8/1984 |
| JP | 59-139034 | 8/1984 |
| JP | 62-044740 | 2/1987 |
| JP | 62-052551 | 3/1987 |
| JP | 63-085553 | 4/1988 |
| JP | 04-075059 | 3/1992 |
| JP | 11-242323 | 9/1999 |
| JP | 2001-312043 | 11/2001 |
| JP | 3093632 | 2/2003 |
| JP | 2003-195479 | 7/2003 |
| JP | 2003-195483 | 7/2003 |
| JP | 2004-039884 | 2/2004 |
| TW | 509819 | 11/2002 |
| TW | 200413838 | 8/2004 |
| WO | WO 03/046659 A1 | 6/2003 |
| WO | WO 2004-006018 A1 | 1/2004 |
| WO | WO 2004-070472 A | 8/2004 |

* cited by examiner

PHOTOMASK BLANK, PHOTOMASK AND METHOD FOR PRODUCING THOSE

TECHNICAL FIELD

The present invention relates to techniques for fabricating a photomask blank and a photomask used for fabricating a semiconductor integrated circuit, a CCD (charge-coupled device), a color filter for an LCD (liquid crystal display device), a magnetic head and so on.

BACKGROUND ART

Finer circuit patterns have grown in demand in response to finer processing of semiconductor devices in recent years, particularly in response to higher levels of integration of large scale integrated circuits. In order to achieve finer circuit patterns, a technique for making fine lines in a wiring pattern making up a circuit, a technique for making a fine pattern of a contact hole used for wiring between layers making up a cell, and other techniques are necessary. These kinds of patterning have been performed by optical lithography using photomasks, and thus techniques for forming finer photomask patterns with high precision have been demanded.

In order to form a photomask pattern on a photomask substrate with high precision, it is necessary to first form a resist pattern on a photomask blank with high precision. Actually a semiconductor substrate is processed by optical lithography using reduced projection, and thus the size of a pattern formed on a photomask used in this exposure process is generally about four times as large as the size of a pattern to be printed on the substrate.

However, the sizes of circuit patterns written by optical lithography have been much smaller than the wavelengths of exposure light in recent years. When a pattern simply four times as large as the shape of a written circuit pattern is used as a photomask pattern, it is difficult to transfer the shape of the photomask pattern as it is on a resist film due to the influence of interference or the like of light generated during exposure. For this reason, it has been necessary to form a photomask pattern with extremely high precision on a photomask serving as a master of a written circuit pattern. In order to reduce the influence of the interference or the like of light during exposure, a photomask pattern (so-called OPC pattern) having a more complicated shape than an actually written circuit pattern may be used in some cases.

As described above, also in lithography techniques for obtaining photomask patterns, high patterning accuracy is desired as in optical lithography techniques for performing fine processing on semiconductor substrates and so on. A limited resolution is generally used as an index of lithography performance. However, in reality, a lithography technique for a process of patterning a photomask requires a limited resolution equal to or higher than that of an optical lithography technique for a process of printing a pattern formed on the photomask onto a semiconductor substrate.

Photomask patterns have been mainly formed by electron beam exposure, though an exposing method using light has been available. Generally, a photoresist film is first formed on a photomask blank including a light shielding layer on a transparent substrate, a pattern is written on the photoresist film by an electron beam, and the photoresist film is developed, so that a resist pattern is obtained. After that, a pattern (photomask pattern) including a light shielding part and a translucent part is formed by using the resist pattern as an etching mask for a mask layer. An ordinary mask layer has a laminated structure of an antireflective layer and a light shielding layer.

As finer photomask patterns are formed, finer resist patterns are formed. When only a resist pattern is made finer without reducing the thickness of a resist film, a resist part acting as an etching mask for a mask layer increases in aspect ratio (a ratio between the thickness of the resist film and a pattern width). Generally, when the aspect ratio of a resist pattern increases, the shape of the pattern is apt to deteriorate, reducing the accuracy of transferring the pattern to a mask layer with the resist pattern serving as an etching mask. Moreover, in extreme cases, a part of the resist pattern may fall or come off, so that pattern loss may occur. Therefore, as finer photomask patterns are formed, it is necessary to reduce the thickness of a resist used as an etching mask for patterning a mask layer and prevent an extremely high aspect ratio.

Incidentally, a number of materials have been already proposed as light shielding film materials for performing patterning on a mask layer by using a resist as an etching mask. Of these materials, regarding etching of a chromium compound film, a large amount of information is available. In practical use, a chrome compound is always used as a light shielding film material, which has been substantially established as a standard processing process. For example, Patent document 1 (Japanese Patent Laid-Open No. 2003-195479), Patent document 2 (Japanese Patent Laid-Open No. 2003-195483), and Patent document 3 (Japanese Registered Utility Model No. 3093632) disclose examples of the configuration of a photomask blank in which a light shielding film having a light shielding property demanded of photomask blanks for ArF exposure is made of a chromium compound. The thickness of the light shielding film is set at about 50 nm to 77 nm, and the light shielding film having this thickness is patterned only with a resist mask.

A light shielding film of a chromium film and a chromium compound film is generally patterned by chlorine-based dry etching containing oxygen. In many cases, this etching condition produces an etching effect that is not negligible on an organic film such as a resist. Thus when etching the light shielding film with a relatively thin resist film serving as a mask, the resist is damaged and the shape of the resist pattern is changed during the etching, so that it becomes difficult to precisely transfer the original resist pattern onto the light shielding film.

However, it is technically difficult to allow a photoresist, which is an organic film, to have etching resistance (plasma resistance) enabling a high resolution and high patterning accuracy. Thus in order to reduce the load on a resist during the etching of a light shielding film and form a photomask pattern with higher precision, the selection of a material of the light shielding film has to be reexamined.

[Patent document 1] Japanese Patent Laid-Open No. 2003-195479

[Patent document 2] Japanese Patent Laid-Open No. 2003-195483

[Patent document 3] Japanese Registered Utility Model No.

[Patent document 4] Japanese Patent Laid-Open No. 2001-312043

[Patent document 5] Japanese Patent Laid-Open No. 63-85553

DISCLOSURE OF INVENTION

Problem to be Solved by the Invention

As to a material of a light shielding film, a number of examination examples have been already available. For example, in Patent document 4 (Japanese Patent Laid-Open No. 2001-312043), an example is reported in which a tantalum metal film is used as a light shielding layer for ArF exposure. In this example, the tantalum metal film is used as a light shielding layer and a tantalum oxide film is used as an antireflective layer. The total thickness of a mask layer including these two layers is set at about 70 nm. In addition to such a layered structure, in order to reduce a load on a resist during the etching of the mask layer, the mask layer is etched by fluorine gas plasma that causes relatively less damage on the resist. However, even if such etching conditions are selected, a reduction in the load on the resist is limited during the etching of the mask layer as long as the light shielding layer and antireflective layer having a total thickness of about 70 nm are used only with the resist serving as an etching mask. It is thus difficult to sufficiently satisfy a need for high-precision formation of a fine mask pattern.

On the other hand, techniques for reducing a load on a resist during dry etching by using a hard mask have been attempted in the past. For example, Patent document 5 (Japanese Patent Laid-Open No. 63-85553) discloses a technique of performing dry etching on a metal silicide film while using, as an etching mask, a $SiO_2$ film formed on the metal silicide film. However, the $SiO_2$ film is less conductive and thus charge-up may occur during electron beam exposure. Further, a defect inspection of a photomask blank is generally performed based on a reflectivity, and light having a wavelength of 257 nm is used for a defect inspection of a mask for ArF exposure. For a correct defect inspection, a reflectivity of about 10% to 20% is necessary in light having this wavelength. However, when using the $SiO_2$ film as an etching mask, the reflectivity of the $SiO_2$ film becomes too high and interferes with the defect inspection.

As described above, in the layered structure of the conventional photomask blank, it is difficult to sufficiently respond to a need for high-precision formation of a fine photomask pattern. This problem is serious particularly in a photomask pattern for ArF exposure in which exposure light has a short wavelength and a high resolution is necessary.

The present invention is designed in view of these problems and has as its object the provision of a photomask blank and a photomask fabricated using the photomask blank. The photomask blank has a configuration capable of reducing a load on a photoresist used as a mask when forming a photomask pattern and capable of forming a fine photomask pattern with high precision, and the photomask blank has physical properties required for a defect inspection and so on.

Means for Solving Problem

A first invention is a photomask blank comprising a light shielding layer of a metal film which cannot be substantially etched by chlorine-based dry etching containing oxygen ((Cl+O) based) and can be etched by chlorine-based dry etching not containing oxygen (Cl based) and fluorine-based dry etching (F based) and an antireflective layer of a metal compound film which cannot be substantially etched by chlorine-based dry etching not containing oxygen (Cl based) and can be etched by at least one of chlorine-based dry etching containing oxygen ((Cl+O) based) and fluorine-based dry etching (F based).

The metal film is preferably a metal or alloy mainly composed of at least one metallic element selected from tantalum (Ta), tungsten (W), zirconium (Zr), hafnium (Hf), vanadium (V), niobium (Nb), aluminum (Al), and germanium (Ge).

Further, it is preferable that the light shielding layer is made up of a plurality of metal films, has an optical density OD of not lower than 2 relative to the wavelength of exposure light, and has a thickness of 15 nm to 50 nm.

Moreover, it is preferable that the antireflective layer has an extinction coefficient k of 0.2 to 1.0 relative to the wavelength of exposure light and includes at least one of a chromium compound film and a silicide film. The chromium compound is preferably a compound mainly composed of chromium oxide, chromium nitride, or nitride chromate. It is more preferable that the chromium compound has a composition ranging from 30 to 85 at. % chromium (Cr), 0 to 60 at. % oxygen (O), 0 to 50 at. % nitrogen (N), and 0 to 20 at. % carbon (C).

Moreover, the silicide is preferably a compound mainly composed of silicon oxide, silicon nitride, or silicon oxygen nitride. It is more preferable that the silicide has a composition ranging from 10 to 57 at. % silicon (Si), 0 to 60 at. % oxygen (O), 0 to 57 at. % nitrogen (N), and 0 to 30 at. % carbon (C).

Second to fifth inventions are methods of fabricating a photomask using a photomask blank including an antireflective layer of a metal compound film which cannot be substantially etched by chlorine-based dry etching not containing oxygen (Cl based) and can be etched by at least one of chlorine-based dry etching containing oxygen ((Cl+O) based) and fluorine-based dry etching (F based), the antireflective layer being stacked on a light shielding layer of a metal film which cannot be substantially etched by chlorine-based dry etching containing oxygen ((Cl+O) based) and can be etched by chlorine-based dry etching not containing oxygen (Cl based) and fluorine-based dry etching (F based). The methods includes the following steps:

The second invention includes a first step of patterning the antireflective layer by (Cl+O)-based dry etching using a resist mask formed by patterning on the principle surface of the antireflective layer, and a second step of patterning the light shielding layer by Cl-based dry etching using the patterned antireflective layer as a hard mask.

The third invention includes a first step of patterning the antireflective layer by (Cl+O)-based dry etching using a resist mask formed by patterning on the principle surface of the antireflective layer, and a second step of patterning the light shielding layer by F-based dry etching using the patterned antireflective layer as a hard mask.

The fourth invention includes a first step of patterning the antireflective layer by F-based dry etching using a resist mask formed by patterning on the principle surface of the antireflective layer, and a second step of patterning the light shielding layer by Cl-based dry etching using the patterned antireflective layer as a hard mask.

The fifth invention includes a step of successively patterning the antireflective layer and the light shielding layer by F-based dry etching using a resist mask formed by patterning on the principle surface of the antireflective layer.

In the second to fifth inventions, the resist mask preferably has a thickness of 75 nm to 350 nm and more preferably has a thickness of 100 nm to 250 nm.

Further, it is preferable to include, subsequently to the second step of the second to fourth inventions or the step of F-based dry etching of the fifth invention, a step of additionally providing a second resist mask formed by patterning on the patterned antireflective layer after the resist mask is removed, and a step of patterning the antireflective layer and the light shielding layer by dry etching using the second resist mask.

EFFECT OF THE INVENTION

In the present invention, materials having different etching characteristics (different kinds of material) are selected as the materials of the antireflective layer and the light shielding layer, the configuration of a new photomask blank is used for reducing a load on a resist mask by using the etching selectivity during the formation of a photomask pattern, and the compositions and thicknesses of films making up these layers are properly selected, thereby providing a photomask blank that has a configuration capable of reducing a load on the resist mask and forming a fine photomask pattern with high precision and has physical properties required for a defect inspection, and a photomask fabricated using the photomask blank.

DESCRIPTION OF THE SYMBOLS

| | |
|---|---|
| 11 | photomask substrate |
| 12 | light shielding layer |
| 13 | antireflective layer |
| 14 | buffer layer |
| 15 | etching stopper layer |
| 16 | phase shift layer |
| 17, 17a | resist film |

DETAIL DESCRIPTION OF THE INVENTION

The present invention will now be described with reference to the accompanying drawings.

The inventor et al. have earnestly conducted studies to solve a problem of reducing a load on a resist mask that is used during the formation of a photomask pattern. As a result, it has been found that by optimally selecting and combining materials having different dry etching characteristics for an antireflective layer and a light shielding layer that make up a mask layer, it is possible to reduce a load on a resist mask during the formation of a photomask pattern and obtain a photomask (blank) having physical properties required for a defect inspection and so on.

For a light shielding layer included in a conventional photomask blank, the same material as an antireflective layer has been selected in view of facilitation and simplification of the fabrication process. Hence, the antireflective layer and the light shielding layer have similar etching characteristics, and a process of etching and processing the antireflective layer and the light shielding layer has been used with a resist mask provided on the antireflective layer.

In contrast, the present invention uses a new configuration in which materials having different etching characteristics (different kinds of material) are selected as materials of an antireflective layer and a light shielding layer and a load on a resist mask during the formation of a photomask pattern is reduced using the etching selectivity.

When using the etching selectivity of the antireflective layer and the light shielding layer, a resist mask can be used, for example, only as the etching mask of the antireflective layer and the light shielding layer can be etched by using the patterned antireflective layer as a hard mask (specifically described later). As a result, a load on the resist mask is reduced and a change of the shape of a resist pattern is considerably reduced, so that the original resist pattern is precisely transferred to the antireflective layer. By etching the light shielding layer with the patterned antireflective layer serving as a hard mask, a predetermined photomask pattern is precisely transferred on the light shielding layer.

Moreover, with the configuration of the photomask blank of the present invention, the time of etching using the resist mask is shortened and thus the thickness of a resist can be reduced. Therefore, a fine photomask pattern does not cause a too high aspect ratio and it is possible to avoid problems about pattern transfer accuracy reduced by a deteriorated shape of a pattern, a pattern loss due to a partially exfoliated resist pattern, and so on.

The materials are selected under the conditions that the antireflective layer has physical properties required for a defect inspection and so on. Thus, unlike the conventional photomask blank described in Japanese Patent Laid-Open No. 63-85553, the reflectivity of the antireflective layer is not so high as to make a defect inspection difficult. The present invention will be more specifically described below in accordance with the following embodiments.

Embodiment 1

(Basic Configuration of a Photomask Blank)

Figure 1:
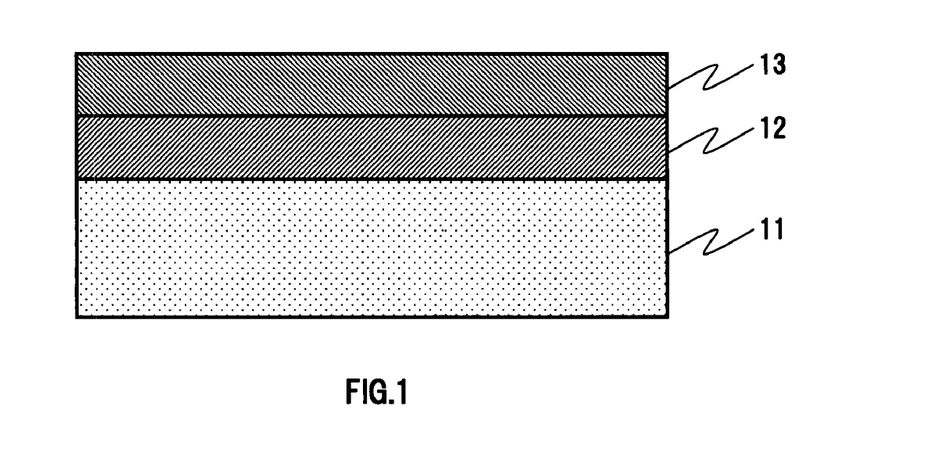
FIG. 1 is a sectional schematic view for explaining an example of the basic configuration of a photomask blank according to the present invention.

FIG. 1 is a sectional schematic view for explaining an example of the basic configuration of a photomask blank of the present invention. The photomask blank includes, on one principle surface of a photomask substrate 11, a metal film as a light shielding layer 12. The metal film cannot be substantially etched by chlorine-based dry etching containing oxygen ((Cl+O)-based dry etching) and can be etched by chlorine-based dry etching not containing oxygen (Cl-based dry etching) and fluorine-based dry etching (F-based dry etching). The photo mask blank further includes, on the light shielding layer 12, a metal compound film as an antireflective layer 13. The metal compound film cannot be substantially etched by chlorine-based dry etching not containing oxygen (Cl-based dry etching) and can be etched by at least one of chlorine-based dry etching containing oxygen ((Cl+O)-based dry etching) and fluorine-based dry etching (F-based dry etching). The photomask substrate 11 is not particularly limited and may be an ordinary transparent substrate made of quartz glass, $CF_2$, aluminosilicate glass, or other materials.

In this case, the conditions of (Cl+O)-based dry etching may be known conditions conventionally used for performing dry etching on a chromium compound film, and the conditions of (Cl+O)-based dry etching are not particularly limited. For example, the mixing ratio of chlorine gas and oxygen gas ($Cl_2$ gas:$O_2$ gas) is set at 1:2 to 20:1 in terms of the volume flow rate ratio, and inert gas containing helium and so on is mixed when necessary. Further, it has been confirmed that when oxygen gas is mixed with a volume flow rate ratio of 5% or higher relative to chlorine gas, etching does not substantially proceed on the metal film used as the light shielding layer of the photomask blank of the present invention. In the subsequent embodiments, including the present embodiment, etching gas mixed with gas containing chlorine gas with a flow rate of 20 sccm, oxygen gas with a flow rate of 9 sccm, and helium gas with a flowrate of 80 sccm is introduced into an etching chamber, a pressure in the chamber is set at 2 Pa, and then dry etching is performed.

Moreover, in the conditions of Cl-based dry etching, the volume mixing ratio of oxygen gas is set lower than 5% relative to chlorine gas. It is generally preferable to use only chlorine gas as etching gas. In this embodiment, only chlorine gas with a flow rate of 20 sccm was used and etching was performed with a pressure of 2 Pa in the chamber.

The gas used for F-based dry etching is fluorine-containing gas such as $CF_4$ and $C_2F_6$. Gas containing oxygen and so on may be added when necessary. In this embodiment, $C_2F_6$ gas is used, only $C_2F_6$ gas with a flow rate of 20 sccm is used, and a pressure in the chamber is set at 2 Pa.

As a metal film for the light shielding layer 12 having such etching characteristics, a metal film mainly composed of metals such as tantalum (Ta), tungsten (W), zirconium (Zr), hafnium (Hf), vanadium (V), niobium (Nb), aluminum (Al), and germanium (Ge) is available. These materials have a higher extinction coefficient than a chromium (Cr) metal film in light having a wavelength of 193 nm used for ArF exposure, and thus these materials are advantageous to a reduction of thickness. These metal films may be used as single layers or a plurality of different metal films may be stacked to form the light shielding layer 12. Moreover, the compositions of these metal films are not limited to single elements and an alloy of two or more metals selected from the metallic elements may be used.

In order to allow such a metal film to act as the light shielding layer 12 of a photomask, it is necessary to provide a sufficient light shielding property against exposure light used in a photolithography process and it is preferable to have an optical density (OD) of 2 or higher relative to exposure light. Particularly in order to set the OD value at 2 or higher for the photomask for ArF exposure (exposure light wavelength=193 nm) enabling suitable application of the photomask blank of the present invention, the thickness of the metal film is preferably set at 15 nm or larger. On the other hand, when the thickness of the metal film is too large, a load becomes too heavy in the etching process. Thus a thickness of 50 nm or less is preferable for precise patterning of the light shielding layer 12.

Further, the metal film may contain nonmetals such as oxygen, nitrogen, and carbon. When the metal film contains the nonmetals of a certain amount or more, the light shielding property of the light shielding layer deteriorates and it becomes difficult to obtain a predetermined optical density. Particularly in the case of a photomask blank for fabricating a photomask for ArF exposure, it is preferable that nitrogen and carbon are 30 at. % or less, oxygen is 10 at. % or less, and the total of nitrogen, carbon, and oxygen is 40 at. % or less.

Such a light shielding layer can be formed on the photomask substrate by a known and ordinary technique including a vacuum deposition method and a sputtering method. However, a sputtering method using a target containing a predetermined metal makes it possible to easily obtain a film of high uniformity.

As a material of the antireflective layer 13 provided on the light shielding layer 12 made of materials selected thus, a chromium compound or silicide is selected. A chromium compound is easily etched by chlorine-based dry etching containing oxygen ((Cl+O) based) but has etching resistance to chlorine-based dry etching not containing oxygen (Cl based) and fluorine-based dry etching (F based). Further, silicide can be etched by fluorine-based dry etching (F based) but has resistance to chlorine-based dry etching containing oxygen ((Cl+O) based) and chlorine-based dry etching not containing oxygen (Cl based).

Table 1 shows, for better understanding of the following explanation, etching characteristics (tendency) under the dry etching conditions of the materials ("ETCHED" indicates that etching is performed and "NOT ETCHED" indicates that etching does not substantially occur).

TABLE 1

| LAYER | MATERIAL | F based | Cl based | (Cl + F) based |
|---|---|---|---|---|
| ANTIREFLECTIVE LAYER | CHROMIUM COMPOUND | NOT ETCHED | NOT ETCHED | ETCHED |
| ANTIREFLECTIVE LAYER | SILICIDE | ETCHED | NOT ETCHED | NOT ETCHED |
| LIGHT SHIELDING LAYER | METAL FILM | ETCHED | ETCHED | NOT ETCHED |

A chromium compound film having such etching characteristics includes a film mainly composed of chromium oxide and chromium nitride or nitride chromate. The chromium compound film may contain nonmetals such as carbon and fluorine. The antireflective film may be formed of a chromium compound film having a single composition. Moreover, chromium compound films having a plurality of different compositions may be stacked to form an antireflective layer. The antireflective layer of the chromium compound film can be obtained by a known method such as reactive sputtering using chromium as a target.

The specific atomic composition of the chromium compound film is selected such that an extinction coefficient k is 0.2 to 1.0 relative to exposure light. For example, the atomic composition ranges from chromium (Cr)=30 at. % to 85 at. %, oxygen (O)=0 at. % to 60 at. %, nitrogen (N)=0 at. % to 50 at. %, and carbon (C)=0 at. % to 20 at. %. When the antireflective layer is formed of a chromium compound, the thickness is determined according to conditions including the wavelength of light used for inspecting a mask. When fabricating a mask for ArF exposure, the thickness is preferably set at about 15 nm to 30 nm. The antireflective layer of the chromium compound film having the composition and the thickness has a reflectivity of 10% to 20% relative to light having a wavelength of 257 nm which is a representative wavelength for inspecting a reflectivity.

An ordinary resist is not so resistant to chlorine-based dry etching containing oxygen ((Cl+O) based) and thus is susceptible to damage in the etching process. However, by reducing the thickness of the antireflective layer to about 15 nm to 30 nm, the patterning of the antireflective layer can be completed before the shape of the resist pattern is changed by damage. It is thus possible to transfer the original resist pattern onto the antireflective layer with high precision.

A silicide film having the above etching characteristics includes a film containing silicon oxide and silicon nitride or silicon oxygen nitride (silicide film) and a film formed by containing oxide and nitride or silicon oxygen nitride of transition metals in these films (a film of a silicon transition metal compound). These films may contain carbon. The antireflective layer may be formed of a silicide film having a single composition. Moreover, silicide films having a plurality of different compositions may be stacked to form the antireflective layer.

Transition metals contained in the film include, for example, molybdenum (Mo), tantalum (Ta), tungsten (W), zirconium (Zr), hafnium (Hf), vanadium (V), and niobium (Nb). Molybdenum is preferable in view of ease of etching. When a silicon transition metal compound (for example, MoSiON) obtained by selecting molybdenum as such a transition metal is used for the antireflective layer and the antireflective layer is combined with the light shielding layer, preferable etching is achieved as compared with a combination of the antireflective layer of the tantalum oxide film and the light shielding layer of the tantalum film in Japanese Patent Laid-Open No. 2001-312043. Thus a photomask pattern can be obtained with high precision.

Further, the silicide compound film obtained by containing silicide and the silicon transition metal or carbon in these films can be obtained by a known method. For example, the known method includes reactive sputtering which is performed in reactive gas or mixed air flow of reactive gas and argon by using silicon, molybdenum silicide, molybdenum and silicon, or molybdenum silicide and silicon as a target.

The specific atomic composition of the silicide film is also selected such that the extinction coefficient k is 0.2 to 1.0 relative to exposure light. For example, the composition ranges from a transition metal ($M_{tr}$)=0.2 at. % to 25 at. %, silicon (Si)=10 at. % to 57 at. %, oxygen (O)=0 at. % to 60 at. %, nitrogen (N)=0 at. % to 57 at. %, and carbon (C)=0 at. % to 30 at. %. When the antireflective layer is formed of silicide, the thickness is determined according to conditions including the wavelength of light used for inspecting a mask. When fabricating a mask for ArF exposure, the thickness is preferably set at about 15 nm to 30 nm. The antireflective layer of the silicide film having the composition and the thickness has a reflectivity of 10% to 20% relative to light with a wavelength of 257 nm which is a representative wavelength for inspecting a reflectivity.

By combining the light shielding layer and the antireflective layer having such etching characteristics, the antireflective layer can be etched using a resist mask and the shielding layer can be etched by using the patterned antireflective layer as a hard mask.

In other words, when selecting a chromium compound as a material of the antireflective layer, patterning is performed on the antireflective layer by using the resist mask through chlorine-based dry etching containing oxygen ((Cl+O) based). In this dry etching process, the metal film of the light shielding layer is resistant to chlorine-based dry etching containing oxygen ((Cl+O) based) and thus is not substantially etched. Therefore, by using the patterned antireflective layer as a hard mask, the light shielding layer can be etched by chlorine-based dry etching not containing oxygen (Cl based) or fluorine-based dry etching (F based). Moreover, the antireflective layer is not substantially etched in chlorine-based dry etching not containing oxygen (Cl based) and fluorine-based dry etching (F based) which are the etching conditions of the antireflective layer. Thus the pattern shape of the hard mask including the antireflective layer is not changed and a photomask pattern can be formed on the light shielding layer with high precision.

When selecting silicide as a material of the antireflective layer, the antireflective layer is subjected to F-based dry etching by using the resist mask. An ordinary resist film has relatively high resistance under the conditions of F-based etching. Thus even when the metal film enabling F-based dry etching is etched successively with the etching of the antireflective layer of silicide enabling F-based dry etching, a load on the resist pattern can be relatively light in the etching process.

Embodiment 2

(Phase Shift Mask Blank)

A mask blank of the present invention may be configured as a phase shift mask blank.

Figure 2:
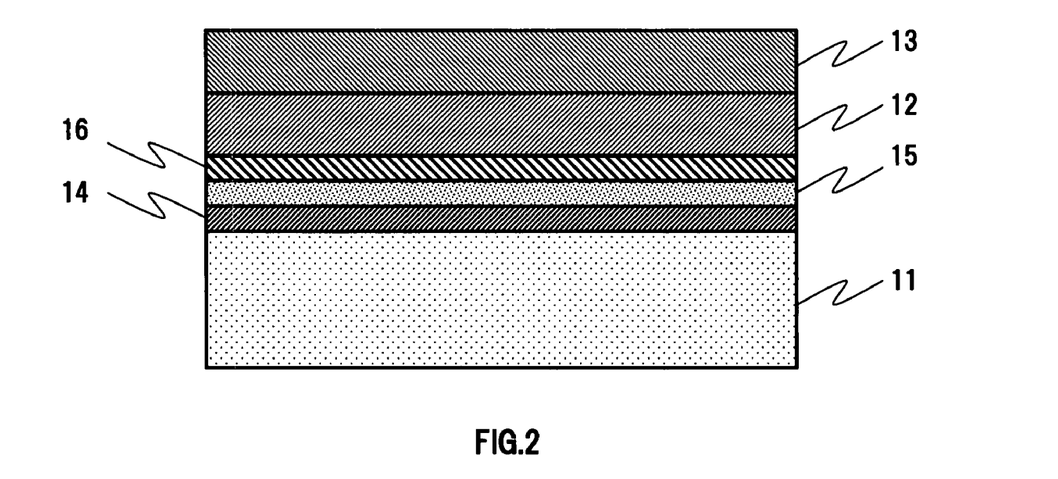
FIG. 2 is a sectional schematic view for explaining a structural example in which the photomask blank of the present invention is configures as a phase shift mask blank.

FIG. 2 is a sectional schematic view for explaining a structural example of a photomask blank of the present invention. The photomask blank is configured as a phase shift mask blank. A transparent or translucent phase shift layer 16 is provided on one principle surface of a photomask substrate 11. A light shielding layer 12 and an antireflective layer 13 (described above) are sequentially stacked on the phase shift layer 16. A variety of known phase shift films can be used for the phase shift layer 16, and the phase shift layer 16 may be a composite film formed by combining these films. Further, the absorber material of the phase shift layer 16 may be replaced with a halftone material to form a halftone phase shift layer.

Layers denoted as 14 and 15 in FIG. 2 are a buffer layer and an etching stopper layer. These layers are not always necessary but are provided as required according to the application purpose of a photomask blank. It is needless to say that the provision of the buffer layer 14 and/or the etching stopper layer 15 is not limited to the phase shift mask blank of the present embodiment and thus these layers may be provided in a photomask blank configured as described in Embodiment 1.

As described above, various configurations are available for the phase shift layer 16. A preferable example of a highly transparent film includes a single-layer film mainly composed of silicon oxide and silicon nitride or silicon oxygen nitride, or a composite film in which these films are stacked.

When the phase shift layer 16 is made up of a film for attenuating transmitted light, the film includes a film mainly made of silicon oxide and silicon nitride or silicon oxygen nitride (silicide film) and a film formed by containing oxide and nitride or silicon oxygen nitride of transition metals in these metals (film of silicon transition metal compound). These films may contain carbon. Further, the phase shift layer 16 may be formed using a transition metal thin film as a transmitted light attenuation film.

When the phase shift layer 16 is a halftone phase shift layer, the composition of materials is adjusted such that a single-layer film or multilayer film made of the above materials has a transmittance of 2% to 40% and a phase shift amount of about 180°.

When selecting, as a material of the phase shift layer 16, a material enabling fluorine-based dry etching (F based), the following advantage is obtained: the dry etching process of the phase shift layer 16 combined with the light shielding layer does not become complicated more than necessary and dry etching can be performed with high precision.

An example of the halftone phase shift film enabling fluorine-based dry etching (F based) includes a film mainly made of silicon oxide and silicon nitride or silicon oxygen nitride (silicide film) and a film formed by containing oxide and nitride or silicon oxygen nitride of transition metals in these films (a film of a silicon transition metal compound). These films can be used as either of single-layer films or films making up a composite film of a halftone phase shift film by controlling the content of oxygen and nitrogen or transition metals in the films. An example of the composite film made up of these films includes a composite film obtained by combining the silicide film, a silicon transition metal compound film, a metal silicide film mainly composed of these compounds, and a metal film mainly composed of molybdenum and tantalum or tungsten.

Embodiment 3

Example 1 of the Processing Process of a Photomask Blank

In the present embodiment, an example of the processing process of a photomask blank will be described. The photomask blank includes an antireflective layer of a chromium compound. In the following explanation, the photomask blank is a so-called binary mask blank (see FIG. 1) in which only a light shielding layer and the antireflective layer are provided on a transparent photomask substrate.

Figure 3A:
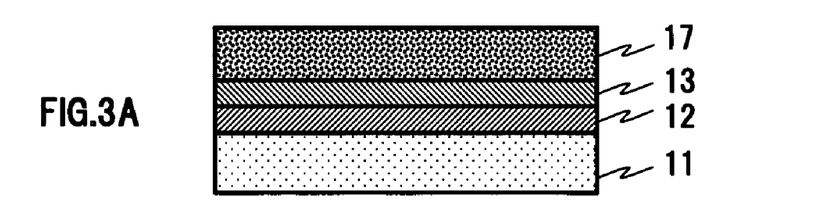
FIGS. 3A to 3E are drawings for explaining a process example for explaining the processing process of the photomask blank according to the present invention.

FIGS. 3A to 3E are process drawings for explaining the processing process of the present embodiment. First, a light shielding layer 12 including a metal film having the composition and thickness described in Embodiment 1 and an antireflective layer 13 made of a chromium compound are sequentially stacked on a transparent photomask substrate 11. A resist film 17 is formed on the antireflective layer 13 (FIG. 3A). In order to prevent the occurrence of problems such as the exfoliation and falling of a fine pattern in the subsequent process, it is preferable to perform surface treatment for reducing the surface energy of the photomask substrate 11 before the formation of the resist film 17.

A preferable method of the surface treatment includes a method of forming alkylsilyl on a surface of a photomask substrate by using hexamethyldisilazane (HMDS), which is regularly used in a semiconductor fabrication process, and other organic silicon surface treatment agents. Further, it is possible to use a method of exposing the surface of the photomask substrate 11 into gas of the surface treatment agent or a method of directly applying the surface treatment agent onto the surface of the photomask substrate 11. Such surface treatment is performed to reduce the surface energy of the photomask substrate 11, and then a resist is applied and dried on the photomask substrate 11 to obtain the resist film 17. As a matter of course, the conditions of applying the resist and the method of drying the resist are properly selected according to a resist material.

The used resist is properly selected according to a write system used for preparing a photomask pattern. As a resist for electron beam (EB) writing, a positive or negative resist having an aromatic skeleton in a polymer is generally used. When fabricating a photomask having a finer pattern, it is preferable to use a chemical amplification resist.

The thickness of the resist film 17 is set such that an excellent pattern shape is obtained and the resist film 17 can act as an etching mask. Particularly when fabricating a photomask for ArF exposure requiring the formation of a fine pattern, it is necessary to set a relatively small thickness for the resist film 17 to prevent an aspect ratio from increasing. The thickness is preferably set at 350 nm or less and more preferably set at 250 nm or less.

On the other hand, the lower limit of the thickness of the resist film 17 is determined in view of overall conditions such as the etching resistance of a used resist material. When using an ordinary resist material, the thickness is preferably set at 75 nm or more and more preferably set at 100 nm or more. When using "multilayer resist method" with a combination of a resist using a silicone resin and a lower film using an aromatic resin and "surface imaging method" with a combination of an aromatic chemical amplification resist and a silicone surface treatment agent, the total thickness of the resist film 17 can be smaller than the above values.

Figure 3B:
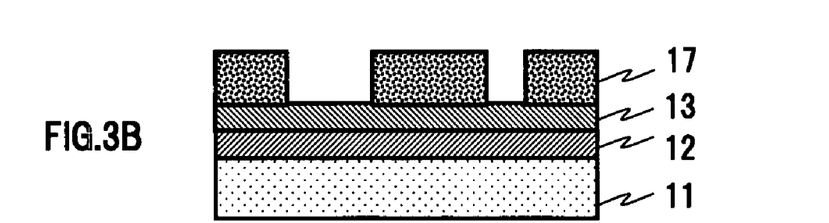

A resist pattern can be obtained by processing the resist film 17 configured thus (FIG. 3B). Although writing on the resist film 17 at this point can be performed by a method of photoirradiation, a method of EB irradiation is generally used, which is a preferable method for forming a fine pattern. For example, when a chemical amplification resist is used and writing is performed on the resist by EB irradiation, writing is generally performed with an electron beam having an energy density of 3 mC/cm$^2$ to 30 mC/cm$^2$, and heating and development are performed after the writing, so that a resist pattern is obtained.

Figure 3C:
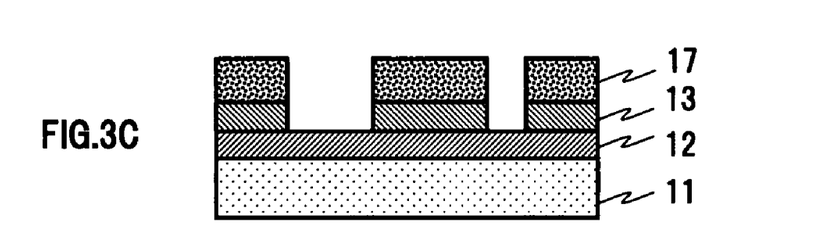

The antireflective layer 13 of a chromium compound is patterned by chlorine-based dry etching containing oxygen ((Cl+O) based, FIG. 3C). As described above, under the (Cl+O)-based etching conditions, the etching rate of an organic film such as a resist is higher than that of fluorine-based dry etching (F based). Although damage on a resist pattern is added during the etching of the antireflective layer 13, the thickness of the antireflective layer 13 of a chromium compound can be generally set at about 15 nm to 30 nm, enabling high precision processing with a resist pattern having a thickness of 100 nm to 250 nm. The thickness of the resist is sufficiently larger than that of the antireflective layer 13 to be etched.

Figure 3D:
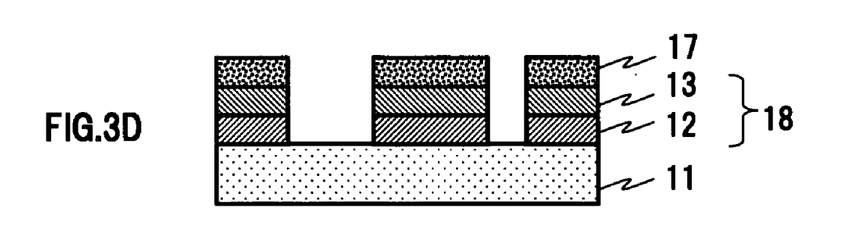

The light shielding layer 12 is patterned after the patterning of the antireflective layer 13 (FIG. 3D). As described above, a metal film made of metals such as tantalum and tungsten and an alloy is so resistant to etching as to prevent substantial etching in chlorine-based dry etching containing oxygen ((Cl+O) based). Therefore, in order to etch the light shielding layer 12, the etching condition is changed to fluorine-based dry etching (F based) or chlorine-based dry etching not containing oxygen (Cl based) before patterning is performed. In the etching of the light shielding layer 12, the chromium compound film serving as the antireflective layer 13 is not substantially etched in any one of F-based and Cl-based dry etching conditions. Thus the antireflective layer 13 sufficiently acts as an etching mask (hard mask) and high-precision processing can be performed with ease.

Figure 3E:
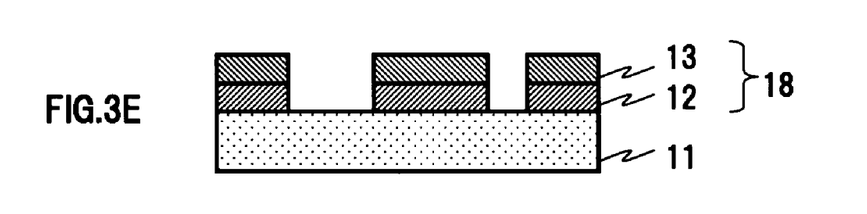

After obtaining a mask layer 18 made up of the antireflective layer 13 and the light shielding layer 12 that are patterned thus, the resist film 17 remaining on the patterned antireflective layer 13 is exfoliated, so that a binary photomask (having no phase shift effect) is completed (FIG. 3E).

Embodiment 4

Processing Process Example 2 of a Photomask Blank

In the present embodiment, an example of the processing process of a photomask blank will be described. The photomask blank includes an antireflective layer of silicide. The photomask blank of the present embodiment will be also described as a so-called binary mask blank in which only a light shielding layer and the antireflective layer are provided on a transparent photomask substrate. Thus the processing process is similar to that of FIGS. 3A to 3E. A process of forming a resist pattern (FIGS. 3A and 3B) can be performed in completely the same manner as the processing of the binary mask blank including the antireflective layer of a chromium compound (described above), and thus the explanation thereof is omitted.

When selecting silicide as a material of the antireflective layer, it is preferable to select the F-based etching condition. An ordinary resist material has relatively high resistance to F-based etching. Under the F-based etching condition, etching can be performed concurrently (successively) with the metal film that can be etched under the F-based etching condition. However, in the case of such successive etching, it is necessary to set the thickness of a resist in consideration of damage occurring during the etching of the metal film. Therefore, considering a reduction of the thickness of the resist, it is preferable to adopt a method of first patterning the antireflective layer by F-based dry etching and then patterning the light shielding layer by Cl-based dry etching. By performing such two-step etching, the patterned antireflective layer of silicide can be used as a mask for Cl-based dry etching performed on the light shielding layer. Thus even when the thickness of the resist is reduced, a photomask pattern can be obtained with high precision.

Embodiment 5

Processing Process Example of a Phase Shift Mask Blank

In the present embodiment, an example of the processing process of a phase shift mask blank will be described. The phase shift mask blank includes a phase shift layer under a light shielding layer of a metal film.

Figure 4A:
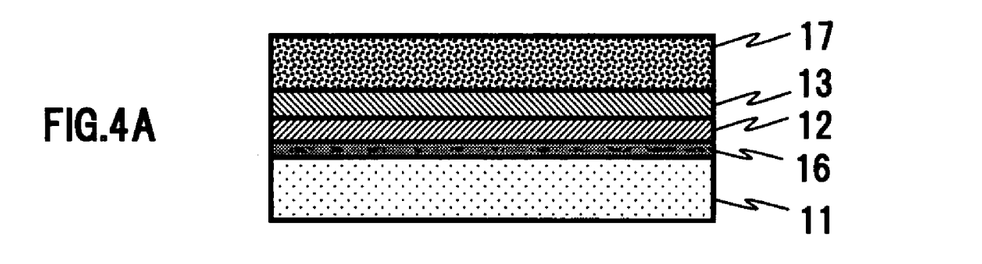
FIGS. 4A to 4I are drawings for explaining a first process example for explaining the processing process of a phase shift mask blank according to the present invention.
Figure 4B:
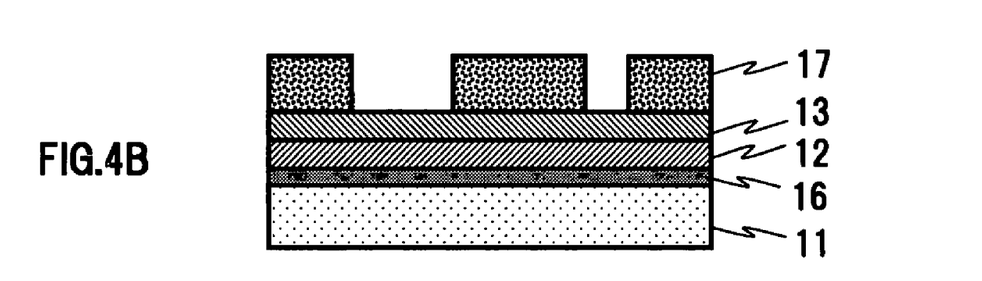
Figure 4C:
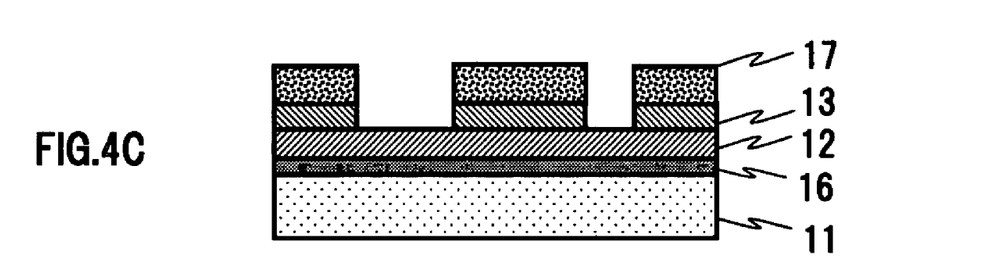
Figure 4D:
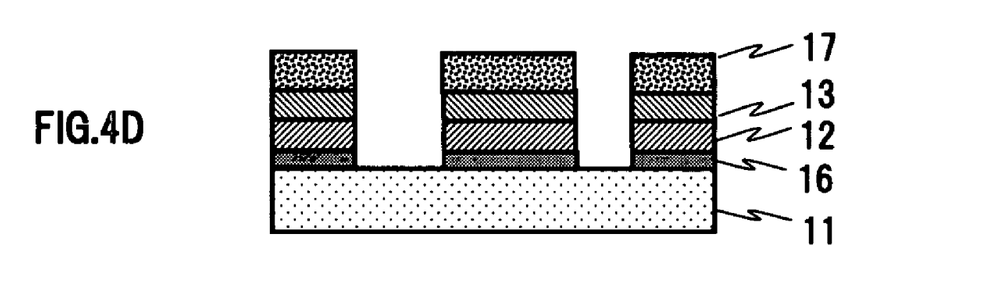

FIGS. 4A to 4I and FIGS. 5A to 5I are both process drawings for explaining the processing process of the present embodiment. In the processing process of the phase shift mask blank illustrated in these drawings, a process of forming a resist pattern (FIGS. 4A and 4B and FIGS. 5A and 5B) and a process of patterning an antireflective layer (FIGS. 4C and 5C) can be performed in completely the same manner as the processing of the binary mask blank (described above) and thus the explanation thereof is omitted.

After the patterning of an antireflective layer 13, a light shielding layer 12 and a phase shift layer 16 are etched to form a phase shift mask pattern. The processing process can be offered in several variations.

Figure 4E:
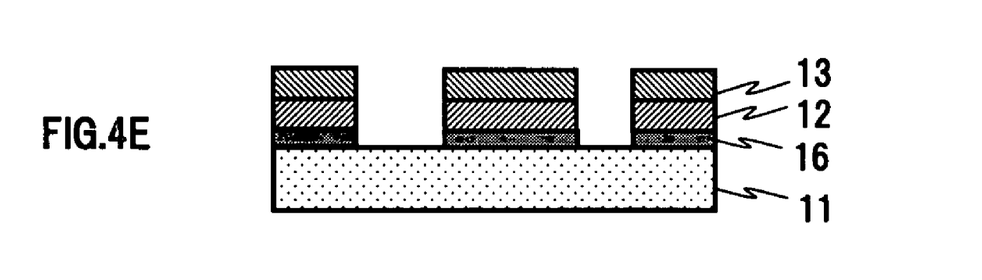
Figure 4F:
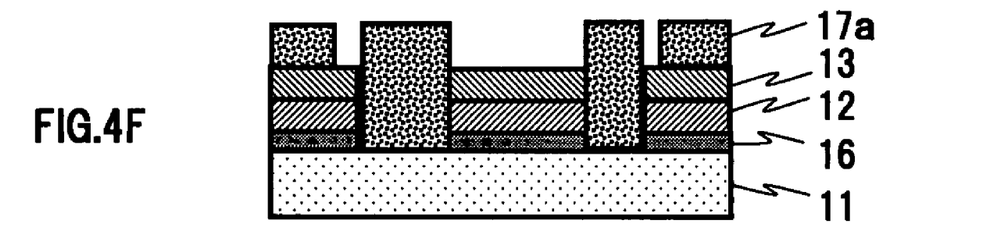
Figure 4G:
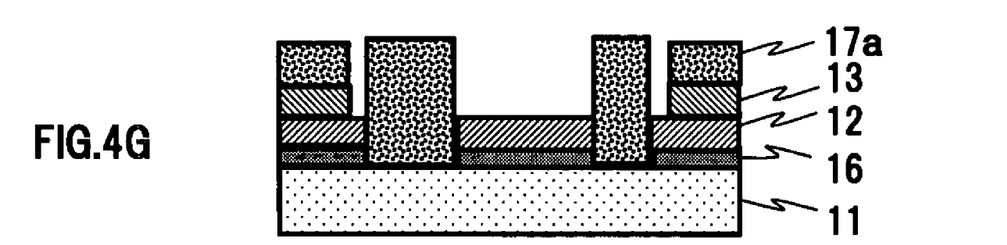
Figure 4H:
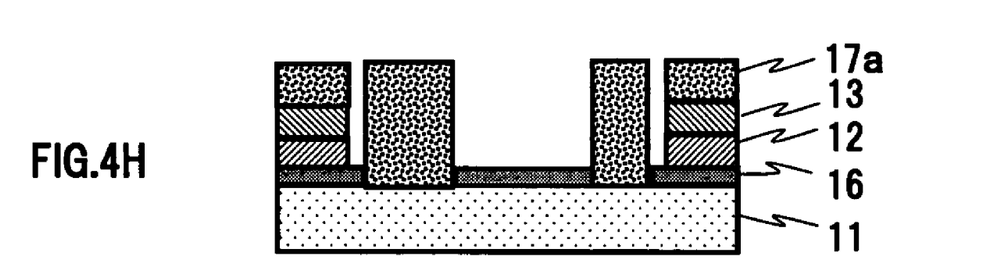
Figure 4I:
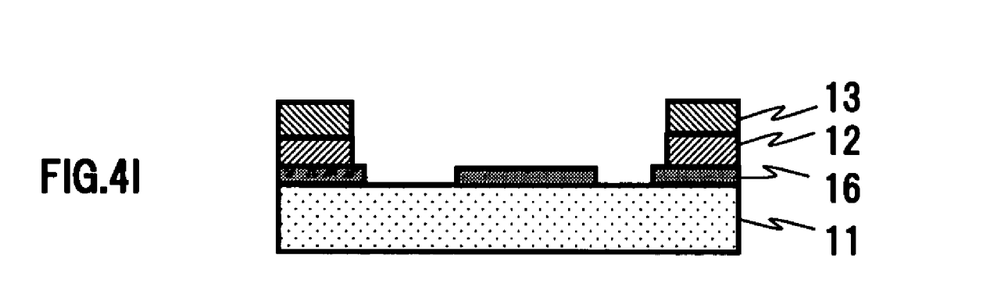
Figure 5A:
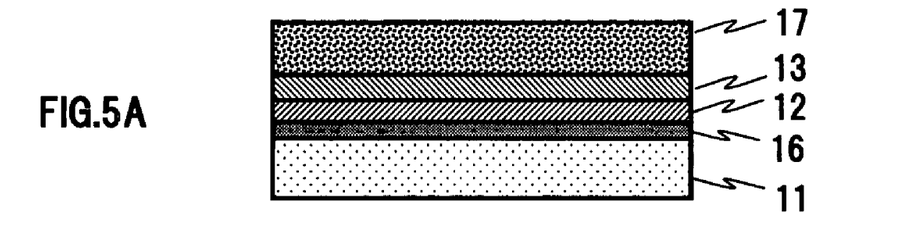
FIGS. 5A to 5I are drawings for explaining a second process example for explaining the processing process of a phase shift mask blank according to the present invention.
Figure 5B:
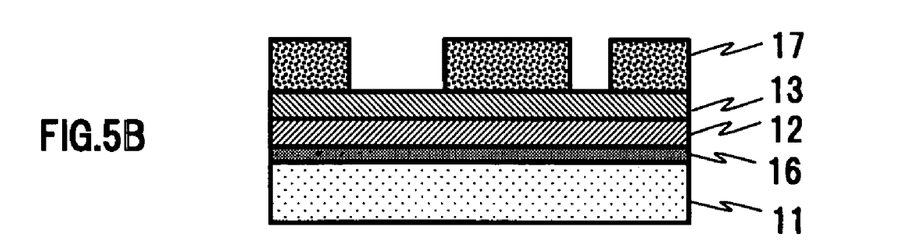
Figure 5C:
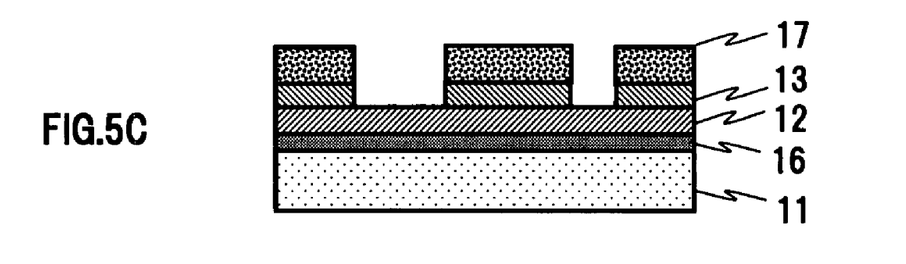
Figure 5D:
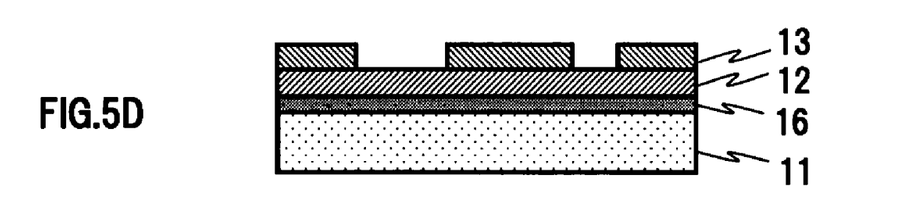
Figure 5E:
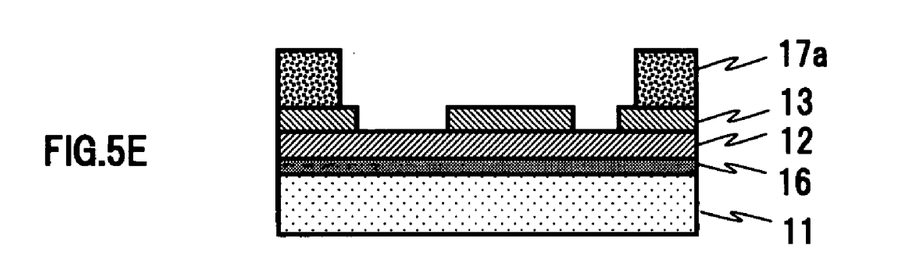

FIGS. 4A to 4I show an example in which the light shielding layer 12 and the phase shift layer 16 are simultaneously patterned under the F-based etching condition without reapplying a resist film 17 used for patterning the antireflective layer 13 (FIG. 4D), and then the remaining resist film 17 is exfoliated (FIG. 4E). Further, in this process example, a resist mask (second resist mask) 17a is formed (FIG. 4F) which covers a portion finally left as a mask layer and a portion where the phase shift layer is removed (a portion where a substrate is exposed). The antireflective layer 13 and the light shielding layer 12 are removed by etching in the other portions by the above technique (FIGS. 4G and 4H), and finally the resist mask 17a is removed, so that a phase shift mask is completed (FIG. 4I). This method is preferable when the antireflective layer 13 is made of a silicide material.

In the present embodiment, the second resist mask 17a is formed using a negative resist. The negative resist is applied on the front side, and a portion where the mask layer is left on the resist film is exposed by pattern exposure. Thereafter, when the entire surface is exposed by irradiating light from the back side of a photomask substrate 11, the resist is exposed only in an area where the phase shift layer 16 is removed. Therefore, by developing the resist, a resist mask shown in FIG. 4F is completed, which protects the portion left as the mask layer and the portion where the substrate is exposed.

However, in this process, the thin resist 17 is removed by etching in the etching process of the light shielding layer 12 and the phase shift layer 16 (process from FIG. 4C to FIG. 4D), so that the surface of the antireflective layer 13 may be exposed and etched. When etching occurs thus on the antireflective layer 13, characteristic values such as a reflectivity may be deviated from design values. For this reason, in the process of FIGS. 4A to 4I, it is necessary to set a large thickness for the first provided resist film 17.

In order to reduce the thickness of the resist film 17 while avoiding the above problem, it is possible to adopt a method of patterning, when the antireflective layer 13 is a chromium compound film, the antireflective layer 13 once and then forming another resist mask covering only a portion finally left as the mask layer. According to this method, the surface of the antireflective layer 13 is positively protected over the etching process, and thus the surface of the antireflective layer 13 is not etched or a reflectivity or the like is not deviated from a design value.

Figure 5F:
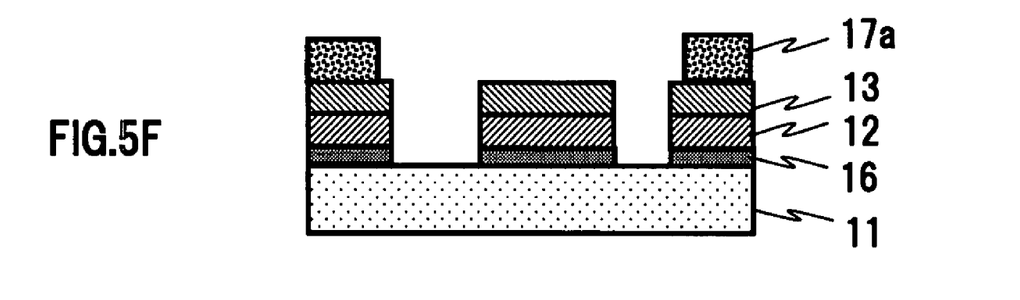

To be specific, after removing the resist film 17 used when the antireflective layer 13 is patterned (FIG. 5D), the resist film 17a is additionally provided on the antireflective layer 13 and patterned thereon (FIG. 5E), and finally only a portion to be left as a mask layer is masked. When the phase shift layer 16 is a halftone phase shift layer (halftone phase shift mask), demand for a finer mask layer pattern is relatively low. Therefore, it is possible to select a resist material used for re-application while placing importance on etching resistance rather than a resolution, so that the surface of the antireflective layer is protected from the subsequent etching process. Further, when using the same resist material as the resist mask of the antireflective layer 13, it is preferable to set a large thickness for the resist. Next, the light shielding layer 12 and the phase shift layer 16 are simultaneously patterned under the F etching condition by using the antireflective layer 13 as an etching mask (FIG. 5F).

Figure 5G:
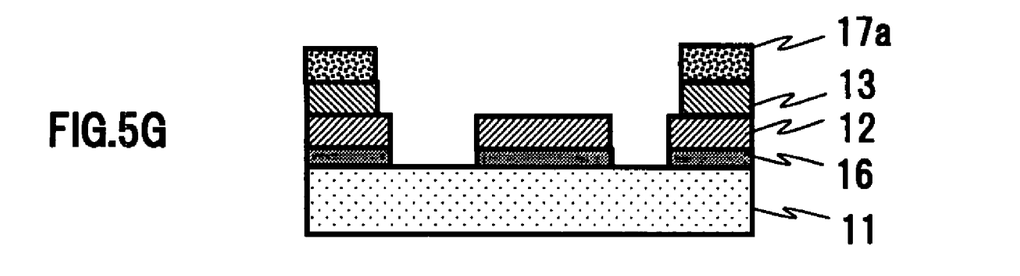
Figure 5H:
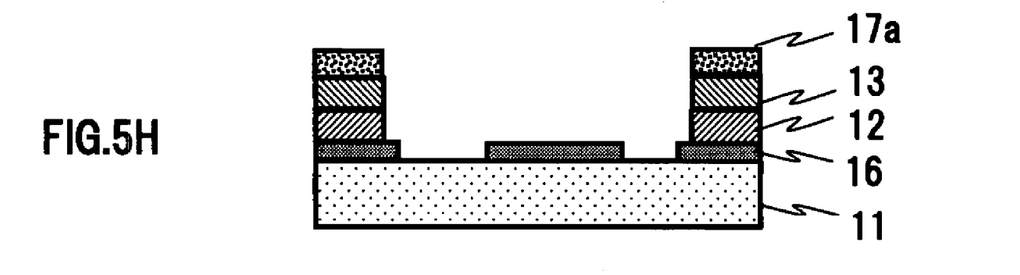
Figure 5I:
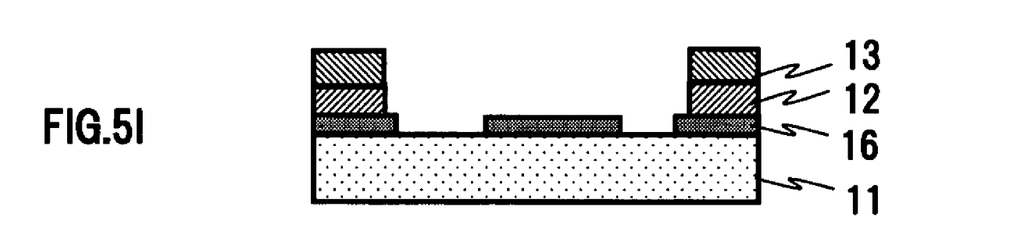

After this patterning, the antireflective layer 13 of a chromium compound is removed by (Cl+O)-based dry etching using the provided resist film 17a as an etching mask (FIG. 5G). After that, the light shielding layer 12 of a metal film is removed by Cl-based dry etching (FIG. 5H) and the resist film 17a is exfoliated, so that a halftone phase shift mask is completed (FIG. 5I).

When it is necessary to finely pattern the mask layer, it is preferable to reapply the resist immediately before the etching of a light shielding pattern. In this case, it is necessary to set a relatively large thickness for the first provided resist to easily keep the resist in the processing process of the antireflective layer, the light shielding layer, and the phase shift layer or it is necessary to design the thickness in consideration of the denaturation of the antireflective layer in the processing process.

When processing a blank for a phase shift mask using a silicide film as the antireflective layer, the resist can be reapplied in the same steps as the case where fine processing is necessary for the mask layer, in the processing of the blank for the phase shift mask including the antireflective layer of the chromium compound.

The photomask blank of the present invention and the photomask fabricated using the photomask blank have been described in the embodiments. These embodiments are just examples for implementing the present invention and thus the present invention is not limited to these embodiments. Various modifications of these embodiments are within the scope of the present invention and it is obvious from the description that other various embodiments are available within the scope of the present invention.

INDUSTRIAL APPLICABILITY

The present invention provides a photomask including a fine photomask pattern formed with high precision, and a photomask blank for providing the photomask.

The invention claimed is:

1. A photomask blank, comprising:
a light shielding layer of a metal film which cannot be substantially etched by chlorine-based dry etching containing oxygen ((Cl+O) based) and can be etched by chlorine-based dry etching not containing oxygen (Cl based) and fluorine-based dry etching (F based) and an antireflective layer of a metal compound film which cannot be substantially etched by chlorine-based dry etching not containing oxygen (Cl based) and can be etched by at least one of chlorine-based dry etching containing oxygen ((Cl+O) based) and fluorine-based dry etching (F based).

2. The photomask blank according to claim 1, wherein the metal film is a metal or alloy mainly composed of at least one metallic element selected from tantalum (Ta), tungsten (W), zirconium (Zr), hafnium (Hf), vanadium (V), niobium (Nb), aluminum (Al), and germanium (Ge).

3. The photomask blank according to claim 1, wherein the light shielding layer is made up of a plurality of stacked metal films.

4. The photomask blank according to claim 1, wherein the light shielding layer has a thickness of 15 nm to 50 nm.

5. The photomask blank according to claim 1, wherein the antireflective layer has an extinction coefficient k of 0.2 to 1.0 relative to a wavelength of exposure light.

6. The photomask blank according to claim 1, wherein the antireflective layer includes at least one of a chromium compound film and a silicide film.

7. The photomask blank according to claim 6, wherein the chromium compound is a compound mainly composed of chromium oxide, chromium nitride, or nitride chromate.

8. The photomask blank according to claim 6, wherein the silicide is a compound mainly composed of silicon oxide, silicon nitride, or silicon oxygen nitride.

9. The photomask blank according to claim 8, wherein the silicide contains oxide, nitride or silicon oxygen nitride of a transition metal.

10. The photomask blank according to claim 9, wherein the transition metal is selected from molybdenum (Mo), tantalum (Ta), tungsten (W), zirconium (Zr), hafnium (Hf), vanadium (V), and niobium (Nb).

11. The photomask blank according to claim 10, wherein the transition metal in the silicide has a concentration ranging from 0.2 at. % to 25 at. %.

12. The photomask blank according to claim 1, wherein the antireflective layer is made up of compound films stacked with different compositions.

13. The photomask blank according to claim 1, wherein the antireflective layer has a thickness of 15 nm to 30 nm.

14. A photomask fabricated using the photomask blank according to claim 1.

15. A method of fabricating a photomask, comprising:
a step of preparing a photomask blank including an antireflective layer of a metal compound film which cannot be substantially etched by chlorine-based dry etching not containing oxygen (Cl based) and can be etched by at least one of chlorine-based dry etching containing oxygen ((Cl+O) based) and fluorine-based dry etching (F based), the antireflective layer being stacked on a light shielding layer of a metal film which cannot be substantially etched by chlorine-based dry etching containing oxygen ((Cl+O) based) and can be etched by chlorine-based dry etching not containing oxygen (Cl based) and fluorine-based dry etching (F based),
a first step of patterning the antireflective layer by (Cl+O) based dry etching using a resist mask formed by patterning on a principle surface of the antireflective layer, and
a second step of patterning the light shielding layer by Cl based dry etching or F based dry etching using the patterned antireflective layer as a hard mask.

16. A method of fabricating a photomask, comprising:
subsequently to the second step of claim 15,
a step of additionally providing a second resist mask formed by patterning on the patterned antireflective layer after the resist mask is removed, and
a step of patterning the antireflective layer and the light shielding layer by dry etching using the second resist mask.

17. The method of fabricating the photomask according to claim 15, wherein the resist mask has a thickness of 75 nm to 350 nm.

18. A method of fabricating a photomask, comprising:
a step of preparing a photomask blank including an antireflective layer of a metal compound film which cannot be substantially etched by chlorine-based dry etching not containing oxygen (Cl based) and can be etched by at least one of chlorine-based dry etching containing oxygen ((Cl+O) based) and fluorine-based dry etching (F based), the antireflective layer being stacked on a light shielding layer of a metal film which cannot be substantially etched by chlorine-based dry etching containing oxygen ((Cl+O) based) and can be etched by chlorine-based dry etching not containing oxygen (Cl based) and fluorine-based dry etching (F based),
a first step of patterning the antireflective layer by F based dry etching using a resist mask formed by patterning on a principle surface of the antireflective layer, and
a second step of patterning the light shielding layer by Cl based dry etching or F based dry etching using the patterned antireflective layer as a hard mask.

19. A method of fabricating a photomask, comprising:
subsequently to the second step of claim 18,
a step of additionally providing a second resist mask formed by patterning on the patterned antireflective layer after the resist mask is removed, and
a step of patterning the antireflective layer and the light shielding layer by dry etching using the second resist mask.

20. The method of fabricating the photomask according to claim 18, wherein the resist mask has a thickness of 75 nm to 350 nm.

* * * * *